United States Patent
Choi et al.

(10) Patent No.: US 10,186,419 B2
(45) Date of Patent: Jan. 22, 2019

(54) METHOD FOR TREATING A SUBSTRATE WITH A SHOCK WAVE

(71) Applicant: Semes Co., Ltd., Cheonan-si, Chungcheongnam-do (KR)

(72) Inventors: Kihoon Choi, Cheonan-si (KR); In-Il Jung, Cheonan-si (KR); Seong-Soo Kim, Cheonan-si (KR); Yoon-Jong Ju, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 233 days.

(21) Appl. No.: 14/931,004

(22) Filed: Nov. 3, 2015

(65) Prior Publication Data

US 2016/0133456 A1 May 12, 2016

(30) Foreign Application Priority Data

Nov. 7, 2014 (KR) .......... 10-2014-0154705

(51) Int. Cl.
| | |
|---|---|
| H01L 21/02 | (2006.01) |
| B24C 1/00 | (2006.01) |
| H01L 21/67 | (2006.01) |
| B24C 11/00 | (2006.01) |

(52) U.S. Cl.
CPC ........ *H01L 21/02057* (2013.01); *B24C 1/003* (2013.01); *B24C 11/005* (2013.01); *H01L 21/02052* (2013.01); *H01L 21/67051* (2013.01)

(58) Field of Classification Search
CPC ..... B24C 1/003; B24C 7/0046; B24C 11/005; H01L 21/67051
See application file for complete search history.

(56) References Cited

U.S. PATENT DOCUMENTS

| | | | | |
|---|---|---|---|---|
| 5,746,646 | A * | 5/1998 | Shibano | B24B 1/04 451/113 |
| 6,048,405 | A * | 4/2000 | Skrovan | B08B 3/102 134/1 |
| 9,595,434 | B2 * | 3/2017 | Kim | H01L 21/02068 |
| 2006/0102207 | A1 | 5/2006 | Moriya | |
| 2007/0222812 | A1 * | 9/2007 | Tokuno | B41J 2/16 347/22 |
| 2008/0161840 | A1 * | 7/2008 | Osiroff | A61B 17/32037 606/159 |
| 2012/0099972 | A1 * | 4/2012 | Guo | C23C 4/18 415/174.4 |
| 2012/0247502 | A1 * | 10/2012 | Moriya | B08B 3/12 134/1 |
| 2012/0247504 | A1 * | 10/2012 | Nasr | B08B 7/0035 134/1.1 |

(Continued)

FOREIGN PATENT DOCUMENTS

| | | |
|---|---|---|
| CN | 1481580 A | 3/2004 |
| CN | 101124065 A | 2/2008 |

(Continued)

*Primary Examiner* — Timothy V Eley
(74) *Attorney, Agent, or Firm* — Harness, Dickey & Pierce, P.L.C.

(57) ABSTRACT

Disclosed is an apparatus and method for treating a substrate. The method includes supplying cleaning particles to the substrate to clean the substrate. The cleaning particles are solid particles. The solid particles provide a shock wave to the substrate.

8 Claims, 8 Drawing Sheets

(56) References Cited

U.S. PATENT DOCUMENTS

| | | | | |
|---|---|---|---|---|
| 2013/0008470 A1* | 1/2013 | Dobashi | ............ | H01L 21/67051 |
| | | | | 134/21 |
| 2013/0040538 A1* | 2/2013 | Scrivani | .................. | B24C 1/003 |
| | | | | 451/39 |
| 2013/0098397 A1* | 4/2013 | Wang | ................ | H01L 21/02074 |
| | | | | 134/6 |
| 2014/0182634 A1* | 7/2014 | Ishibashi | .................. | B08B 3/024 |
| | | | | 134/99.1 |
| 2016/0027637 A1* | 1/2016 | Kim | .................. | H01L 21/02068 |
| | | | | 438/113 |
| 2017/0170035 A1* | 6/2017 | Teng | ................. | H01L 21/67051 |

FOREIGN PATENT DOCUMENTS

| | | |
|---|---|---|
| CN | 101254502 A | 9/2008 |
| CN | 101318187 A | 12/2008 |
| CN | 102482841 A | 5/2012 |
| JP | H05-144793 A | 6/1993 |
| JP | 2006-147654 A | 6/2006 |
| JP | 2011-171691 A | 9/2011 |
| JP | 2012018962 A | 1/2012 |
| KR | 10-0893503 B1 | 4/2009 |
| KR | 10-0910070 B1 | 7/2009 |
| KR | 10-1310513 B1 | 9/2013 |

\* cited by examiner

METHOD FOR TREATING A SUBSTRATE WITH A SHOCK WAVE

CROSS-REFERENCE TO RELATED APPLICATIONS

A claim for priority under 35 U.S.C. § 119 is made to Korean Patent Application No. 10-2014-0154705 filed Nov. 7, 2014, in the Korean Intellectual Property Office, the entire contents of which are hereby incorporated by reference.

BACKGROUND

Embodiments of the inventive concepts described herein relate to an apparatus and a method for treating a substrate, and more particularly, relate to a substrate treating apparatus for cleaning a substrate and a method thereof.

Various processes such as photolithography, etching, ashing, ion implantation, and film deposition are performed on a substrate so as to manufacture a semiconductor device or a liquid crystal display. A substrate cleaning process for removing various contamination materials and particles attached to a substrate surface may be performed before and after each unit process for fabricating a semiconductor device.

Various methods such as spraying a chemical, a treating solution including a gas, or a treating solution with a vibration are used as a cleaning process to remove various contamination materials and particles remaining on the substrate surface.

It is possible to remove remaining contamination materials and particles on the substrate surface by providing a shock wave to a substrate using a liquid of a small size within a range where the substrate is not damaged. However, it may be possible to generate a liquid with a size which is maximally several tens μm.

SUMMARY

Embodiments of the inventive concepts provide a substrate treating apparatus and a method thereof, capable of improving an efficiency of a substrate cleaning process.

Embodiments of the inventive concepts provide a method of treating a substrate.

One aspect of embodiments of the inventive concept is directed to provide a method for treating a substrate, the method including supplying cleaning particles to the substrate to clean the substrate. The cleaning particles may be solid particles. The solid particles may provide a shock wave to the substrate.

Each of the solid particles may have a size of several micrometers.

Each of the solid particles may have a size of several tens or hundreds nanometers.

The method may further include supplying a treating solution to the substrate while the solid particles are supplied to the substrate.

The method may further include supplying a treating solution to the substrate before the solid particles are supplied to the substrate.

The solid particles may be supplied on the treating solution and may provide the shock wave to the substrate.

The solid particles may be formed of a material soluble in the treating solution.

The solid particles may be formed of a material of which the gravity is 1 or less.

The solid particles may be formed of a plastic powder.

The solid particles may be supplied to the substrate by a carrier gas.

The carrier gas may be a helium gas.

The solid particles may be formed of a material which provides the shock wave to the substrate and of which a state is changed into a liquid state or a gas state at room temperature.

The solid particles may be formed of dry-ice.

Embodiments of the inventive concepts provide an apparatus of treating a substrate.

Another aspect of embodiments of the inventive concept is directed to provide an apparatus for treating a substrate including a container having an inner treating space, a support unit placed in the treating space and supporting the substrate, and a supply unit supplying cleaning particles in the treating space. The supply unit comprises a solid nozzle supplying the cleaning particles having solid particles.

Each of the solid particles may have a size of several micrometer s.

Each of the solid particles may have a size of several tens or hundreds nanometers.

The supply unit may include a treating solution supply nozzle supplying a treating solution.

The solid nozzle may include a nozzle unit comprising an upper body and a lower body jointed to the upper body, the lower body including a flow pathway therein; and a cleaning particle supply unit connected with the nozzle unit and supplying a gas, the gas being changed into a solid particle passing through a discharge hole connected from the upper body to the lower body and colliding with the substrate. The flow pathway may include an upper flow pathway formed in a length direction of the nozzle unit such that a diameter thereof gradually decreases along the length direction, and a lower flow pathway formed in a second length direction of the nozzle unit such that a diameter thereof gradually increases along the length direction.

The solid particles may be formed of a material which is sublimated after colliding with the substrate.

The solid particles may be formed of dry-ice.

The solid nozzle may include a nozzle unit having an inner flow pathway, a cleaning particle supply unit connected to the nozzle unit and supplying the cleaning particles, and a carrier gas supply unit connected to the nozzle unit and supplying high-pressure carrier gas to the nozzle unit. The nozzle unit may include an upper body formed along its length direction such that its diameter gradually decreases along the length direction, and a lower body connected to the upper body, and formed in its length direction such that its diameter gradually increases along the length direction.

The solid particles may be a material of which gravity is 1 or less.

The solid particles may be a plastic powder.

The carrier gas may be a helium gas.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
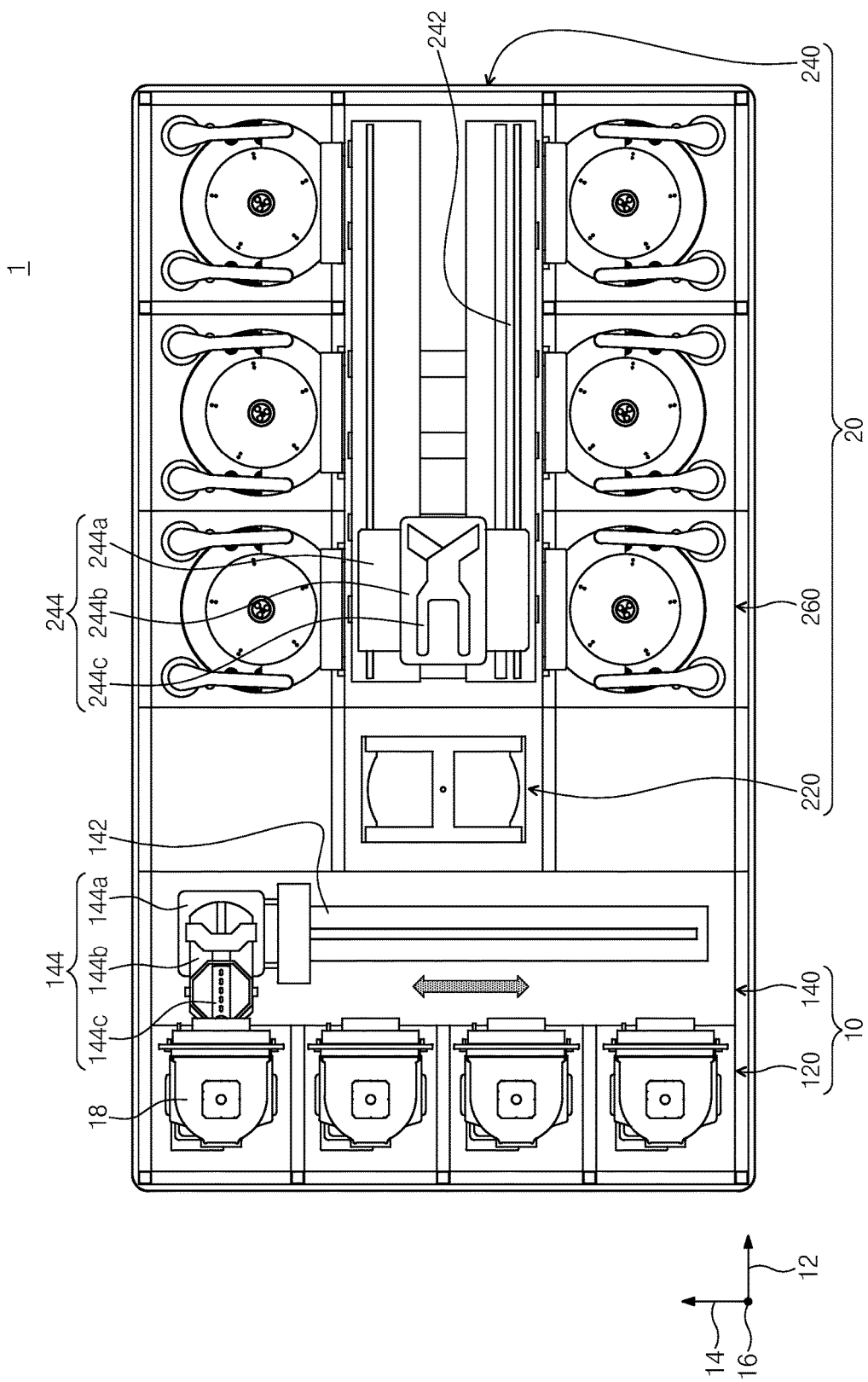
FIG. 1 is a top plan view schematically illustrating a substrate treating apparatus.

Below, Embodiments will be described in detail with reference to the accompanying drawings. The inventive concept, however, may be embodied in various different forms, and should not be construed as being limited only to the illustrated embodiments. Embodiments of the inventive concept are provided to illustrate more fully the scope of the inventive concept to those skilled in the art. Therefore, the shapes of the components in the drawings may be exaggerated to emphasize a more clear description.

FIG. 1 is a top plan view schematically illustrating a substrate treating apparatus according to an embodiment of the inventive concept.

Referring to FIG. 1, a substrate treating apparatus 1 may have an index module 10 and a process treating module 20. The index module 100 may contain a load port 120 and a transfer frame 140. The load port 120, the transfer frame 140, and the process treating module 20 may be arranged in a line. Below, a direction where the load port 120, the transfer frame 140, and the process treating module 20 are arranged may be referred to as "first direction" 12. When viewed from the top, a direction perpendicular to the first direction 12 may be referred to as "second direction" 14, and a direction perpendicular to a plane defined by the first direction 12 and the second direction 14 may be referred to as "third direction" 16.

A carrier 130 where a substrate W is received may be safely put on the load port 120. The load port 120 may be in plurality, and the plurality of load ports 120 may be arranged in a line along the second direction 14. The number of load ports 120 may increase or decrease according to conditions such as process efficiency, footprint, and the like in the process treating module 20. A plurality of slots (not illustrated) may be formed in the carrier 130 so as to receive the substrates W in a state where they are placed in a horizontal position on the ground surface. A Front Opening Unified Pod (FOUP) may be used as the carrier 130.

The process treating module 20 may contain a buffer unit 220, a transfer chamber 240, and process chambers 260. The transfer chamber 240 may be arranged such that its length direction is parallel with the first direction 12. The process chambers 260 may be arranged at opposite sides of the transfer chamber 240 along the second direction 14. The process chambers 260 may be arranged at one side and the other side of the transfer chamber 240 so as to be arranged symmetrically with respect to the transfer chamber 240. The plurality of process chambers 260 may be provided at one side of the transfer chamber 240. A portion of the process chambers 260 may be arranged along a length direction of the transfer chamber 240. Furthermore, a portion of the process chambers 260 may be arranged to be stacked on. That is, the process chambers 260 may be arranged in an A-by-B matrix at the one side of the transfer chamber 240. In this case, "A" may indicate the number of process chambers 260 arranged in a line along the first direction 12, and "B" may indicate the number of process chambers 260 arranged in line along the third direction 16. When four or six process chambers 260 are arranged at the one side of the transfer chamber 240, the process chambers 260 may be arranged in a 2-by-2 or 3-by-2 matrix. The number of process chambers 260 may increase or decrease. Unlikely, the process chambers 260 may be provided at any one side of the transfer chamber 240. In addition, the process chambers 260 may be arranged at one side and opposite sides of the transfer chamber 240 to form a single layer.

The buffer unit 220 may be disposed between the transfer frame 140 and the transfer chamber 240. The buffer unit 220 may provide a space where a substrate W stays before transferred between the transfer chamber 240 and the transfer frame 140. A slot(s) (not illustrated) where a substrate W is placed may be provided in the buffer unit 220. A plurality of slots may be provided to be spaced apart from each other along the third direction 16. The buffer unit 220 may have an opened surface that faces the transfer frame 140 and an opened surface that faces the transfer chamber 240.

The transfer frame 140 may transfer a wafer W between the buffer unit 220 and the carrier 130 safely put on the load port 120. An index rail 142 and an index robot 144 may be provided at the transfer frame 140. The index rail 142 may be provided such that its length direction is parallel with the second direction 14. The index robot 144 may be mounted on the index rail 142 and may move in a straight line toward the second direction 14 along the index rail 142. The index robot 144 may contain a base 144a, a body 144b, and an index arm 144c. The base 144a may be installed to be movable along the index rail 142. The body 144b may be joined to the base 144a. The body 144b may be provided to be movable on the base 144a along the third direction 16. Furthermore, the body 144b may be provided to be rotatable on the base 144a. The index arm 144c may be joined to the body 144b such that it is forward and backward movable with respect to the body 144b. The index arm 144c may be in plurality, and the plurality of index arms 144c may be driven independently of each other. The index arms 144c may be arranged to be stacked on each other under the condition that index arms 144c are spaced apart from each other along the third direction 16. A portion of the index arms 144c may be used to transfer a substrate W from the process treating module 20 to the carrier 130, and a portion of remaining index arms 144c may be used to transfer the substrate W from the process treating module 20 to the carrier 130, thereby preventing particles, generated from a substrate W not experiencing process treating when the substrate W is carried into or taken out of by the index robot 144, from being attached to the substrate W.

The transfer chamber 240 may transfer a substrate W between the buffer unit 220 and the process chamber 260 and between the process chambers 260. A guide rail 242 and a main robot 244 may be provided at the transfer chamber 240. The guide rail 242 may be arranged such that its length direction is parallel with the first direction 12. The main robot 244 may be installed on the guide rail 242 and may move in a straight line along the first direction 12 on the guide rail 242. The main robot 244 may contain a base 244a, a body 244b, and a main arm 244c. The base 244a may be installed to be movable along the guide rail 242. The body 244b may be joined to the base 244a. The body 244b may be provided to be movable on the base 244a along the third direction 16. Furthermore, the body 244b may be provided to be rotatable on the base 244a. The main arm 244c may be joined to the body 244b such that it is forward and backward movable with respect to the body 144b. The main arm 244c may be in plurality, and the plurality of main arms 244c may be driven independently of each other. The main arms 244c may be arranged to be stacked on each other in a state where the main arms 244c are spaced apart from each other along the third direction 16.

A substrate treating apparatus 300 performing a cleaning process for cleaning a substrate W may be provided in the process chamber 260. The substrate treating apparatus 300 may have different structures varied according to types of cleaning processes. In contrast, the substrate treating apparatuses 300 of the process chambers 260 may have the same structure. Selectively, the process chambers 260 may be divided into a plurality of groups. The substrate treating apparatuses 300 in the same groups may have the same structure and the substrate treating apparatuses 300 in different groups may have different structures.

Figure 2:
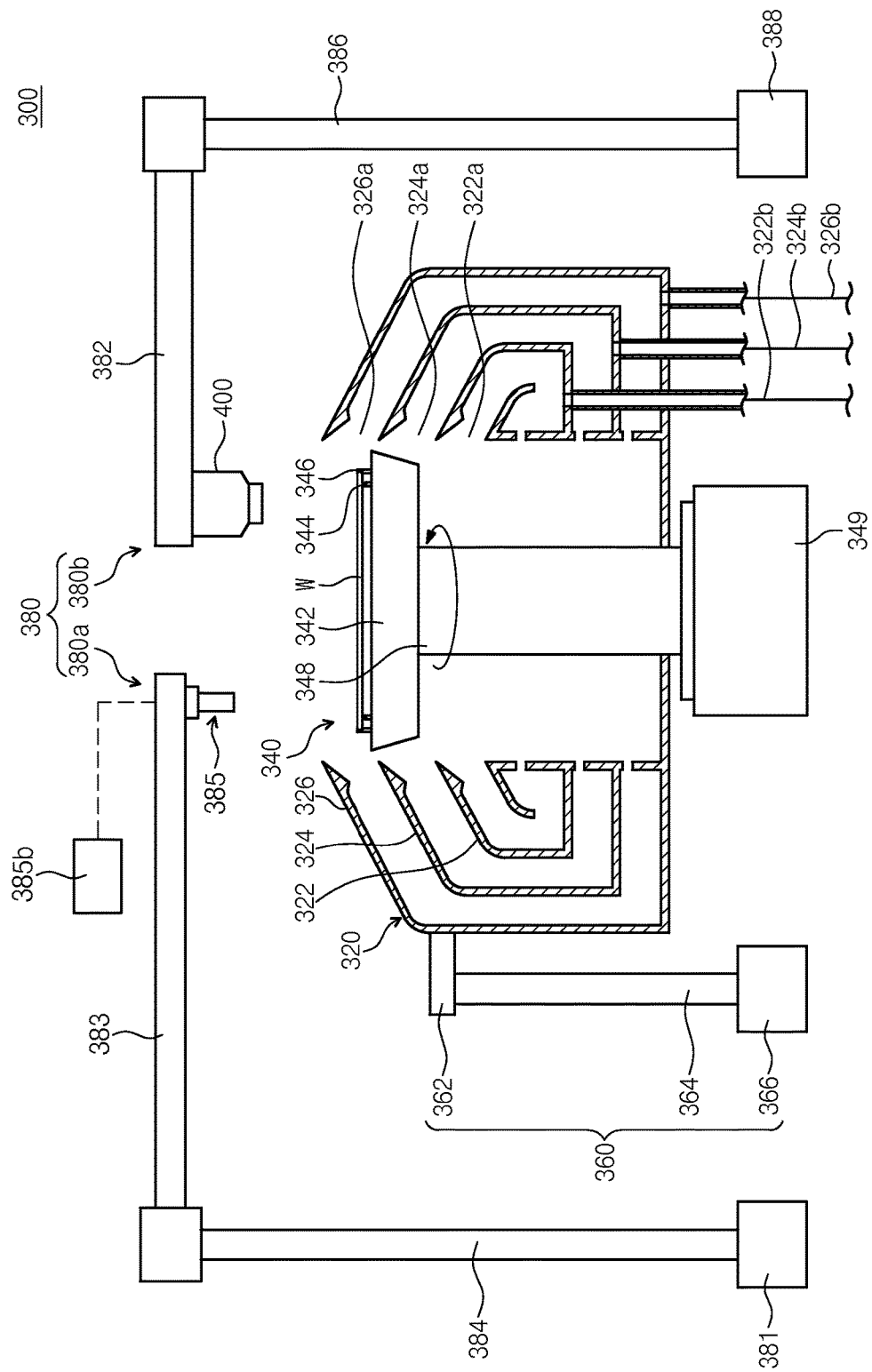
FIG. 2 is a cross-sectional view illustrating a substrate treating apparatus of FIG. 1.

FIG. 2 is a cross-sectional view illustrating a substrate treating apparatus of FIG. 1. Referring to FIG. 2, the substrate treating apparatus 300 may include a container 320, a support unit 340, an elevation unit 360, and a supply unit 380. The container 320 may contain a space where the substrate treating process is performed and an upper portion of the container 320 may be opened. The container 320 may contain an internal collection barrel 322, a middle collection barrel 324, and an external collection barrel 326. Each of the internal, middle, and external collection barrels 322, 324 and 326 may collect different treating solutions from each other among treating solutions used in a process.

The internal collection barrel 322 may be provided in the form of a ring surrounding the support unit 340. The middle collection barrel 324 may be provided in the form of a ring surrounding the internal collection barrel 322 and the external collection barrel 326 may be provided in the form of a ring surrounding the middle collection barrel 322. An internal space 322a of the internal collection barrel 322, a space 324a between the internal collection barrel 322 and the middle collection barrel 324, and a space 326a between the middle collection barrel 324 and the external collection barrel 326 may serve as inlets that allow the treating solutions to flow into the internal collection barrel 322, the middle collection barrel 324, and the external collection barrel 326, respectively. Collection lines 322b, 324b and 326b which extend vertically and downwardly toward the bottom may be connected to the respective collection barrels 322, 324 and 326. The collection lines 322b, 324b and 326b may discharge treating solutions collected by the collection barrels 322, 324 and 326. The discharged treating solutions may be recycled through an external treating solution recycling system (not illustrated).

The support unit 340 may support and rotate a substrate W during a process. The support unit 340 may include a body 342, a support pin 344, a chuck pin 346, and a support shaft 348. The body 342 may have an upper surface provided in the form of a circle when viewed from the top. The support shaft 348 rotated by a motor 349 may be fixedly jointed on a lower surface of the body 342.

The support pin 344 may be provided in plurality. The support pins 344 may be disposed to be spaced apart by a predetermined gap from an edge of the upper surface of the body 342 and may protrude upwardly from the body 342. The support pins 344 may be disposed to have the form of a ring as a whole through a combination thereof. The support pins 344 may support an edge of a rear surface of the substrate W to allow the substrate W to be spaced apart by a predetermined distance from the upper surface of the body 342.

The chunk pin 346 may be provided in plurality. The chuck pins 346 may be disposed such that it is further away from the center of the body 342 than the support pin 344.

The chuck pins 346 may be provided to protrude upwardly from the body 342. The chuck pins 346 may support a side portion of the substrate W to prevent the substrate W from deviating from a given position to a lateral direction when the support unit 340 rotates. The chuck pins 346 may be provided to move in a straight line between a waiting position and a support position along a radius direction of the body 342. The waiting position may be a position such that it is further away from the center of the body 342 than the support position. When the substrate W is loaded on or unloaded from the body 342, the chuck pins 346 may be placed at the waiting position; when a substrate treating process is performed, the chuck pin 346 may be placed at the support position. The chuck pin 346 may be contacted with a side portion of the substrate W at the support position.

The elevation unit 360 may upwardly or downwardly move the container 320 in a straight line. A height of the container 320 relative to the support unit 340 may be changed as the container 320 moves upwardly or downwardly. The elevation unit 360 may include a bracket 362, a moving shaft 364, and a driver 366. The bracket 362 may be fixedly installed to an outer wall of the container 320 and the moving shaft 364 which is moved upwardly or downwardly by the driver 366 may be fixedly jointed to the bracket 362. When the substrate W is loaded on or lifted from the support unit 340, the container 320 may descend such that the support unit 340 protrudes upwardly from an upper portion of the container 320. Furthermore, when the process is performed, a height of the container 320 may be adjusted such that the treating solution flows into a predetermined collection barrel 360 depending on a type of the treating solution supplied to the substrate W. Selectively, the elevation unit 360 may move the support unit 340 upwardly or downwardly.

The supply unit 380 may supply the treating solution and cleaning particles on the substrate W.

The supply unit 380 may include a solid supply unit 380a and a treating solution supply unit 380b. The solid supply unit 380a may supply the cleaning particles on a top surface of the substrate W. The solid supply unit 380a may include a support shaft 384, a nozzle arm 383, a driving member 381, and a solid nozzle 385.

The support shaft 384 may be disposed at one side of the container 320. The support shaft 384 may have a rod form provided in its length direction which is a vertical direction. The support shaft 384 may be rotated, ascended and descended by a driving member 381. In contrast, the support shaft 384 may be moved in a straight line along a horizontal direction, ascended and descended by the driving member 381. The nozzle arm 383 may be fixedly jointed to a top end of the support shaft 384. The nozzle arm 383 may support a solid nozzle 385. A solid nozzle 385 may be placed at the end of the nozzle arm 383.

The solid nozzle 385 may supply cleaning particles provided from an outside to the substrate W. The cleaning particles may contain solid particles. Each of the solid particles may have a size of several micrometers, or a size of several tens or hundreds nanometers.

Figure 3:
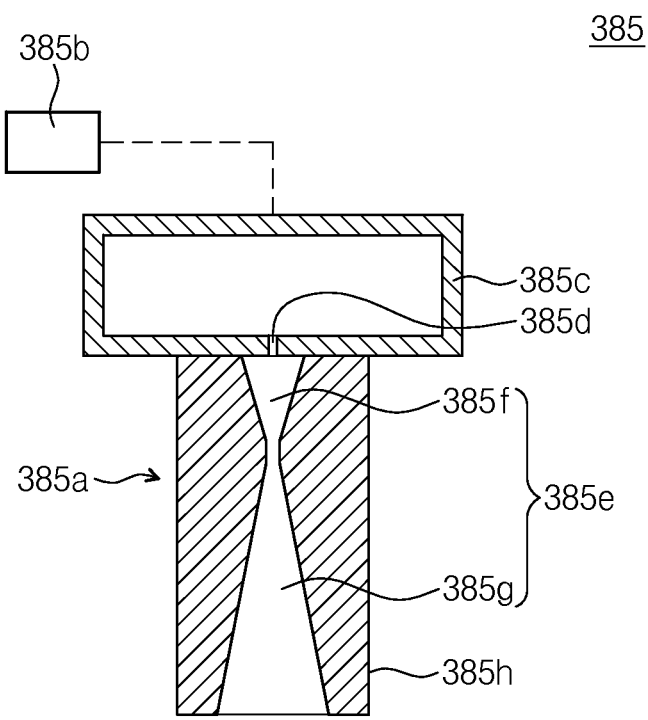
FIG. 3 is a diagram schematically illustrating a solid nozzle of FIG. 2.

FIG. 3 is a diagram schematically illustrating a solid nozzle of FIG. 2. Referring to FIG. 3, the solid nozzle 385 may supply the solid particles on the treating solution and may provide a shock wave to the substrate W. The solid nozzle 385 may include a nozzle unit 385a and a cleaning particle supply unit 385b. The nozzle unit 385a may include an upper body 385c and a lower body 385h. The upper body 385c may be provided in a cylinder form. A space may be defined in the upper body 385c. The upper body 385c may be formed of a material capable of enduring the cleaning particles of the high pressure. The upper body 385*c* may be connected to the cleaning particle supply unit 385*b*. The cleaning particles may be provided into the space of the upper body 385*c* via the cleaning particle supply unit 385*b*.

A discharge hole 385*d* may be formed at the upper body 385*c*. The discharge hole 385*d* may be connected to the lower body 385*h*. For example, the phase of the cleaning particles supplied in a high-pressure gas phase may be changed when passing through the discharge hole 385*d* and may be changed into fine solid particles. For example, the gas supplied to the discharge hole 385*d* may be a carbon dioxide gas and the solid particles may be formed of dry-ice.

The lower body 385*h* may be connected to the upper body 385*c*. A flow pathway 385*e* may be formed in the lower body 385*h*. The flow pathway 385*e* may include an upper flow pathway 385*f* and a lower flow pathway 385*g*. The upper flow pathway 385*f* may be formed to extend along a longitudinal direction of the nozzle unit 385*a*. The upper flow pathway 385*f* may be provided such that its diameter is gradually decreased along the longitudinal direction. The lower flow pathway 385*g* may be connected to the upper flow pathway 385*f*. The lower flow pathway 385*g* may be formed to extend along the longitudinal direction of the nozzle unit 385*a*. The lower flow pathway 385*g* may be provided such that its diameter is gradually increased along the longitudinal direction.

The cleaning particle supply unit 385*b* may be connected to a nozzle unit 385*a* and may supply the cleaning particles. For example, the cleaning particles may be supplied in a gas state when supplied to the nozzle unit 385*a*. The supplied cleaning particles may be supplied to the nozzle unit 385*a* in a high-pressure state. When passing through the discharge hole 385*d*, the cleaning particles supplied to the nozzle unit 385*a* may be changed from a gas phase to a solid phase. That is, the cleaning particles may be changed into the solid particles. For example, the supplied cleaning particles may be the carbon dioxide gas. After the carbon dioxide gas passes through the discharge holes 385*d* and is then changed into a dry-ice phase, the changed carbon dioxide ice may be collided to the substrate W. In contrast, the supplied cleaning particles may be an argon gas.

The treating solution supply unit 380 may include a support shaft 386, a nozzle arm 382, and a treating solution nozzle 400. The support shaft 386 may be disposed at one side of the container 320. The support shaft 386 may have a rod form in which its length direction is an up-and-down direction. The support shaft 386 may be rotated, ascended and descended by a driving member 388. In contrast, the support shaft 386 may be moved, ascended and descended in a straight line along a horizontal direction by the driving member 388. The nozzle arm 382 may be fixedly jointed to a top end of the support shaft 386. The nozzle arm 382 may support a treating solution nozzle 400. The treating solution nozzle 400 may be placed at an end portion of the nozzle arm 382. The treating solution nozzle 400 may supply the treating solution on an upper surface of the substrate W. For example, the supplied treating solutions may include, but not limited to, an organic solvent, chemical solution, rinsing solution, and the like.

As described above, an embodiment of the inventive concept is exemplified as each of the solid supply unit 380*a* and the treating solution supply unit 380*b* includes a support shaft and a nozzle arm, independently. In contrast, a solid nozzle and a treating solution nozzle may be included in one nozzle arm.

Figure 4:
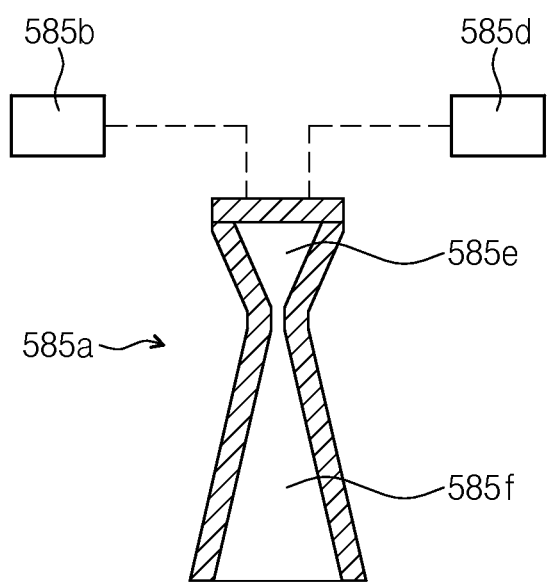
FIG. 4 is a diagram illustrating other embodiment of a solid nozzle of FIG. 2.
Figure 5:
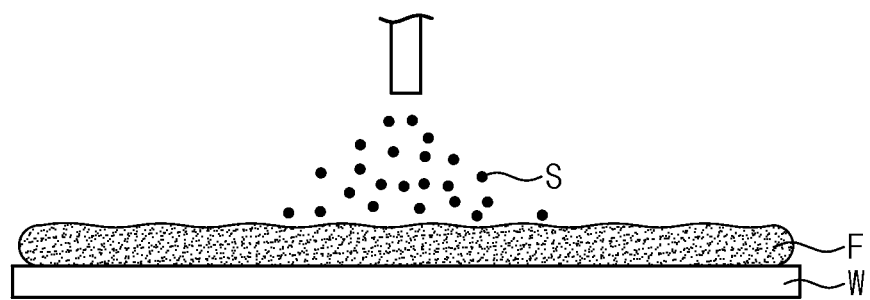
FIGS. 5 to 10 are diagrams sequentially illustrating a process for generating a shock wave on a substrate using solid particles.
Figure 6:
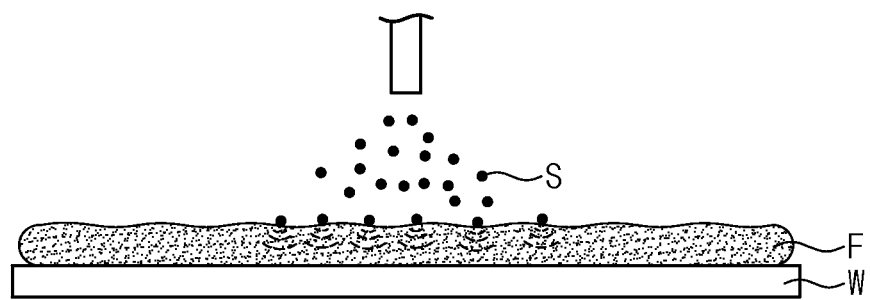

FIG. 4 is a diagram illustrating a solid nozzle according to another exemplary embodiment of the inventive concept. Referring to FIG. 4, a solid nozzle 585 may supply solid particles on the treating solution and may provide a shock wave to the substrate W. The solid nozzle 585 may include a nozzle unit 585*a*, a cleaning particle supply unit 585*b*, and a carrier gas supply unit 585*d*. The nozzle unit 585*a* may include an upper body 585*e* and a lower body 585*f*. The upper body 585*e* may be connected to the cleaning particle supply unit 585*b* and the carrier gas supply unit 585*d*. The upper body 585*e* may be formed to extend in a length direction thereof. The upper body 585*e* may be formed such that a diameter thereof is gradually decreased along a length direction thereof. The lower body 585*f* may be connected to the upper body 585*e*. The lower body 585*f* may be formed to extend in a length direction thereof. The lower body 585*f* may be formed such that a diameter thereof is gradually increased along a length direction thereof.

The cleaning particle supply unit 585*b* may supply the cleaning particles to the nozzle unit. For example, the cleaning particles to be supplied may be supplied in a solid particle state. A size of the solid particles may be several micrometers or several or hundreds nanometers. The solid particles may be formed of a material soluble in the treating solution. The solid particles may be materials of which the gravity is 1 or less. For example, the solid particles may be plastic powder.

The carrier gas supply unit 585*d* may supply a carrier gas to the nozzle unit 585*a*. The carrier gas may be supplied in a high-pressure state. The high-pressure carrier gas may be mixed with the solid particles at the nozzle unit 585*a*. Furthermore, the solid particles may pass through the lower body 585*f* together with the carrier gas and may be supplied on the treating solution. For example, the carrier gas to be supplied may be a helium gas.

FIGS. 5 to 10 are diagrams sequentially illustrating a process for generating a shock wave on a substrate using solid particles. A process for generating a shock wave on a substrate W will be described with reference to FIGS. 5 to 10.

Figure 7:
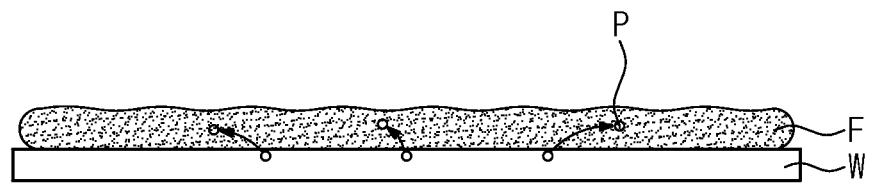
Figure 8:
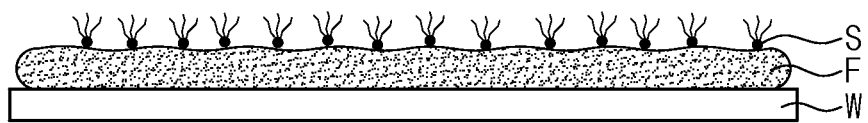
Figure 9:
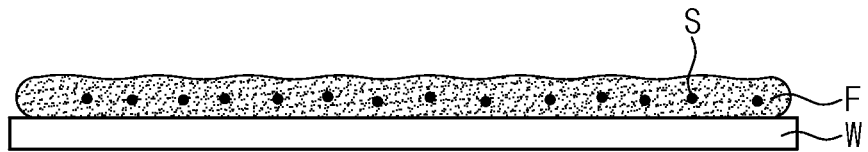
Figure 10:
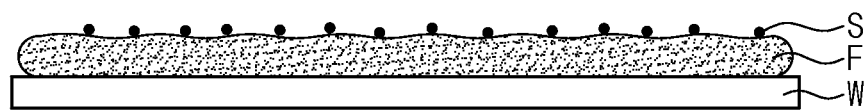

The substrate treating apparatus 300 may supply a treating solution F to the substrate W while the solid particles S are supplied to the substrate W. In contrast, the substrate treating apparatus 300 may supply the treating solution to the substrate W before the solid particles S are supplied to the substrate W. When the treating solution F is supplied, a layer of the treating solution F may be formed on the substrate W. The solid particles S may be rapidly supplied to the substrate W. The solid particles S may collide with the layer of the treating solution F on the substrate W and may generate the shock wave at the treating solution F. The shock wave may be transmitted to the substrate W. Due to the generated shock wave, contamination materials and particles of the substrate W may be easily removed as illustrated in FIG. 7. After the solid particles S collide with the treating solution F, the solid particles S may be vaporized or liquefied as illustrated in FIG. 8. For example, the solid particle may be formed of dry-ice. Furthermore, in the case that the solid particles S are formed of a material soluble in the treating solution, the solid particle S may melt in the treating solution as illustrated in FIG. 9. Selectively, in the case that the solid particles S are materials of which the gravity is 1 or less, the solid particles S may remain at a floated state on the layer of the treating solution F as illustrated in FIG. 10. For example, the solid particles may be plastic powder. Remaining solid particles S may be removed together with the contamination materials and particles of the substrate W in a cleaning process afterward.

According to an embodiment of the inventive concept, a substrate cleaning process may be performed using solid particles where a size thereof is several micrometers, several tens or hundreds nanometers, thereby improving an efficiency of the substrate cleaning process.

Furthermore, According to an embodiment of the inventive concept, a substrate cleaning process may be performed by producing a shock wave using solid particles on a substrate, thereby improving an efficiency of the substrate cleaning process.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for treating a substrate, the method comprising:

supplying a treating solution onto the substrate;

supplying cleaning particles, the cleaning particles being solid particles;

changing the cleaning particles into fine solid particles by passing through a discharge structure; and supplying the fine solid particles onto the treating solution to provide a shock wave at the treating solution to clean the substrate.

2. The method of claim 1, wherein the fine solid particles are formed of a material soluble in the treating solution.

3. The method of claim 1, wherein the fine solid particles are formed of a material with a specific gravity of 1 or less.

4. The method of claim 1, wherein the fine solid particles are formed of a plastic powder.

5. The method of claim 1, wherein the fine solid particles are supplied to the substrate by a carrier gas.

6. The method of claim 5, wherein the carrier gas is a helium gas.

7. The method of claim 1, wherein a state of the fine solid particles changes into a liquid state or a gas state at room temperature.

8. The method of claim 7, wherein the solid particles are formed of dry-ice.

* * * * *